(12) United States Patent
Kim

(10) Patent No.: US 7,403,431 B2
(45) Date of Patent: Jul. 22, 2008

(54) METHOD OF READING A FLASH MEMORY DEVICE

(75) Inventor: Duck Ju Kim, Kyeongki-Do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 187 days.

(21) Appl. No.: 11/103,383

(22) Filed: Apr. 11, 2005

(65) Prior Publication Data

US 2006/0104125 A1 May 18, 2006

(30) Foreign Application Priority Data

Nov. 15, 2004 (KR) ........................ 10-2004-0093176

(51) Int. Cl.
*G11C 7/10* (2006.01)

(52) U.S. Cl. ................. 365/189.05; 365/191; 365/200; 365/230.08

(58) Field of Classification Search ............. 365/189.05, 365/191, 200
See application file for complete search history.

(56) References Cited

U.S. PATENT DOCUMENTS

| | | | | |
|---|---|---|---|---|
| 6,813,214 | B2 * | 11/2004 | Cho et al. | 365/230.04 |
| 7,149,112 | B2 * | 12/2006 | Kim | 365/185.05 |
| 7,257,047 | B2 * | 8/2007 | Kim | 365/230.04 |
| 2007/0223281 | A1 * | 9/2007 | Park | 365/185.22 |

FOREIGN PATENT DOCUMENTS

JP            01-141763            6/1989

* cited by examiner

*Primary Examiner*—Richard T Elms
*Assistant Examiner*—Pho M. Luu
(74) *Attorney, Agent, or Firm*—Marshall, Gerstein & Borun LLP

(57) ABSTRACT

A method of reading a flash memory device wherein the status of a predetermined cell is read in such a way that a plurality of page buffers connected to a memory cell array through a plurality of bit lines are divided into at least two group, and the page buffers are sequentially driven on a group basis. A power loss problem caused by excessive current consumption occurring since all page buffers operate at the same time is avoided.

4 Claims, 3 Drawing Sheets

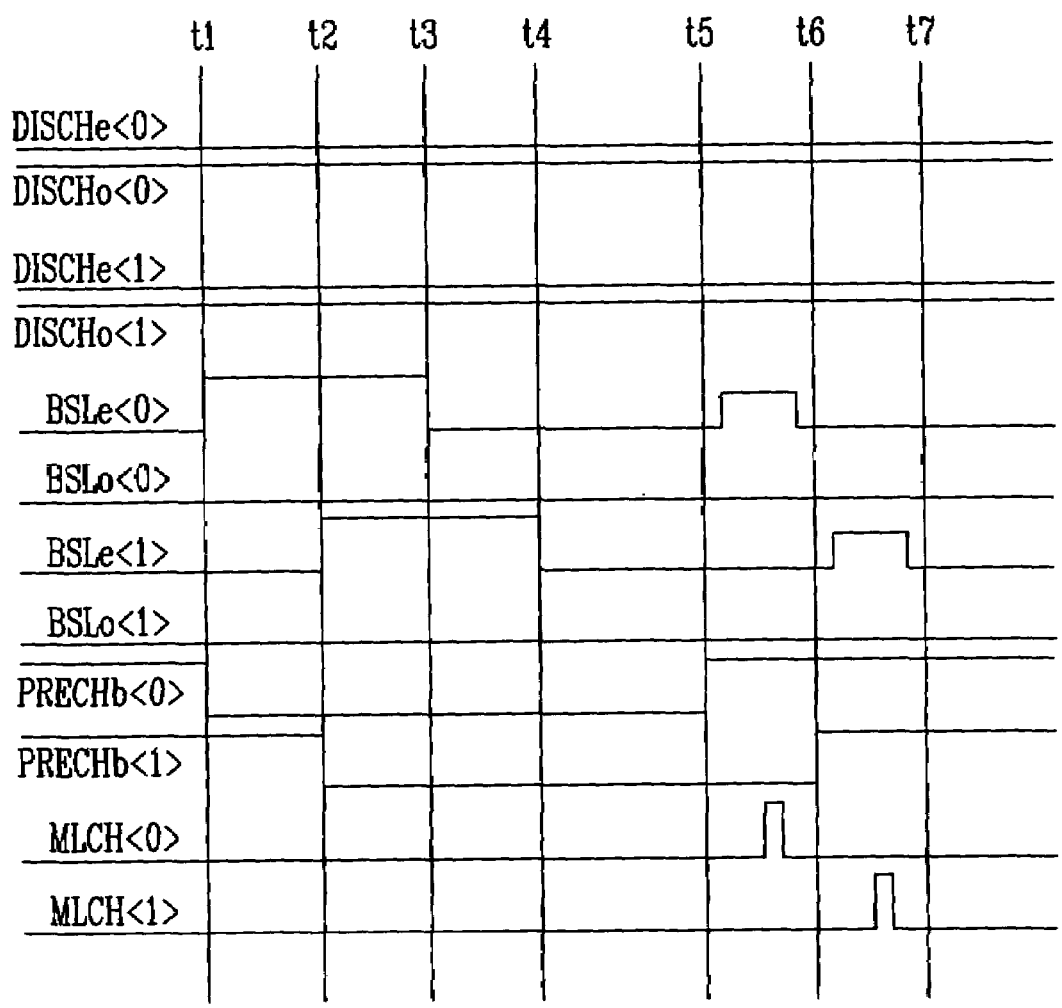

METHOD OF READING A FLASH MEMORY DEVICE

BACKGROUND

1. Technical Field

A method of reading a flash and a NAND type flash memory device is disclosed wherein a plurality of page buffers are divided into predetermined groups and are then sequentially driven on a group basis to prevent erroneous operation due to excessive power consumption.

2. Description of the Related Art

There is an increasing demand for semiconductor memory devices in which electrical programming and erase are allowed, and where a refresh function of rewriting data at a constant cycle is not required. Further, in order to develop large-capacity memory devices capable of storing a large amount of data, the integration of memory cells has been increased. In order to fulfill the higher integration of the memory cells, a NAND type flash memory device has been developed in which a plurality of cells are serially connected to form one string and two strings share one contact. Program and erase of the NAND type flash memory device are performed by controlling a threshold voltage of a memory cell, while injecting or discharging electrons into or from a floating gate by way of F-N tunneling.

Accordingly, an erased cell has a negative threshold voltage since electrons of the floating gate are discharged. A programmed cell has a positive threshold voltage since electrons are injected into a floating gate. In case of the NAND type flash memory device, failure occurs due to charge gain or charge loss. A variety of verification schemes with respect to these characteristics has been developed. In order to perform a read operation for a verifying normal program and erase or store data program, a page buffer is used.

The page buffer temporarily stores data to be stored in a memory cell of a selected page, which is connected to a string of a memory cell array, or reads the status of a cell by sensing and amplifying information on a memory cell of a selected page.

In order to read information on a selected cell of a NAND type flash memory device, all page buffers within one chip must be driven at the same time, and all word lines of a selected block must be enabled. In this state, one cell is selected according to a signal for selecting a cell, and information on the cell is read. At this time, since all word lines of a selected block are enabled, current flows from the page buffer to the cell. If all page buffers of 2 k+64 Byte operate and a highest current flows, an instant peak current becomes too high, which causes power-down to occur within a chip. This results in erroneous operation of a chip. Meanwhile, the peak current increases as the number of page buffers that operate at the same time increases.

SUMMARY OF THE DISCLOSURE

Accordingly, in view of the above problems, a method of reading a flash memory device is disclosed, wherein the current flowing through cells as page buffers operate is reduced, and whereby power-down and erroneous operation of a chip accordingly are prevented.

In such a method of reading a flash memory device, a plurality of page buffers are divided into predetermined groups and are then sequentially driven on a group basis.

In an embodiment, a disclosed method of reading a flash memory device, the status of a predetermined cell is read in such a way that a plurality of page buffers connected to a memory cell array through a plurality of bit lines are divided into at least two group, and the page buffers are sequentially driven on a group basis.

According to another embodiment, in a method of reading a flash memory device that has page buffer, wherein the page buffer includes a first transistor that supplies a ground voltage to a selected memory cell through bit lines, according to a discharge signal, for a read operation, a second transistor for precharging the bit lines according to control signals applied as different electric potentials, and supplying an electric potential depending upon the status of a cell that is connected to the bit lines to input/output nodes, a third transistor for precharging the bit lines by supplying a predetermined voltage to the input/output nodes according to a precharge signal, a fourth transistor for allowing program information to be supplied to a selected cell of the memory cell array through a selected bit line, according to a program signal, upon program, a latch for storing output data from the selected cell of the memory cell array, and outputting the output data to data lines, a fifth transistor for initializing the latch according to an initialization signal, and a sixth transistor for inverting the output data stored in the latch according to an electric potential and an inversion signal of the input/output node, the method comprises: providing the flash memory device consisting of a plurality of the page buffers, dividing the plurality of the page buffers into predetermined groups by dividing signals for driving the transistors, and sequentially applying the divided signals on a group basis, whereby the page buffers are sequentially driven on a group basis.

At least one of the signals for driving the first, second, third and sixth transistors is divided as many as the number of groups of the pages buffers to be divided.

According to another embodiment, a method of reading a flash memory device, wherein a plurality of page buffers operate to read the status of a selected cell, the method comprising:

supplying a predetermined voltage through bit lines connected to a selected memory cell, thus precharging the bit lines, controlling an electric potential of the bit lines according to the status of the memory cell, by stopping the supply of the predetermined voltage, and storing data depending on the status of the memory cell, and outputting the data, wherein the plurality of the page buffers connected to a memory cell array through the bit lines is divided into two or more groups, and is then driven on a group basis, wherein before one group finishes one step, the other group starts the same step, whereby the plurality of the page buffer groups is sequentially driven to read the status of a given cell.

BRIEF DESCRIPTION OF THE DRAWINGS

FIG. 3 is an operational timing diagram for explaining a disclosed method of reading a NAND type flash memory device.

DETAILED DESCRIPTION OF THE PRESENTLY PREFERRED EMBODIMENTS

Figure 1:
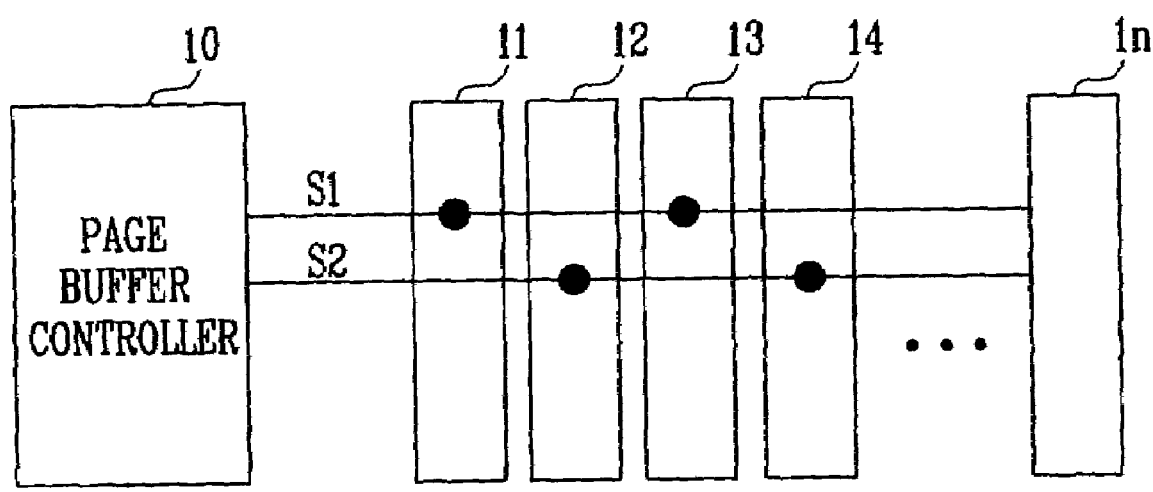
FIG. 1 schematically illustrates a portion of a flash memory device for explaining a disclosed method of reading a NAND type flash memory device.

FIG. 1 schematically illustrates a portion of a flash memory device for explaining a disclosed method of reading a NAND type flash memory device. A plurality of page buffers 11 to 1n are divided into two groups and driven, according to first and second control signals S1 and S2 generated from a page buffer controller 10. That is, odd-numbered page buffers 11, 13, . . . , 1 2n-1 are driven according to the first control signal S1, and even-numbered page buffers 12, 14, . . . , 1 2n are driven according to the second control signal S2.

Figure 2:
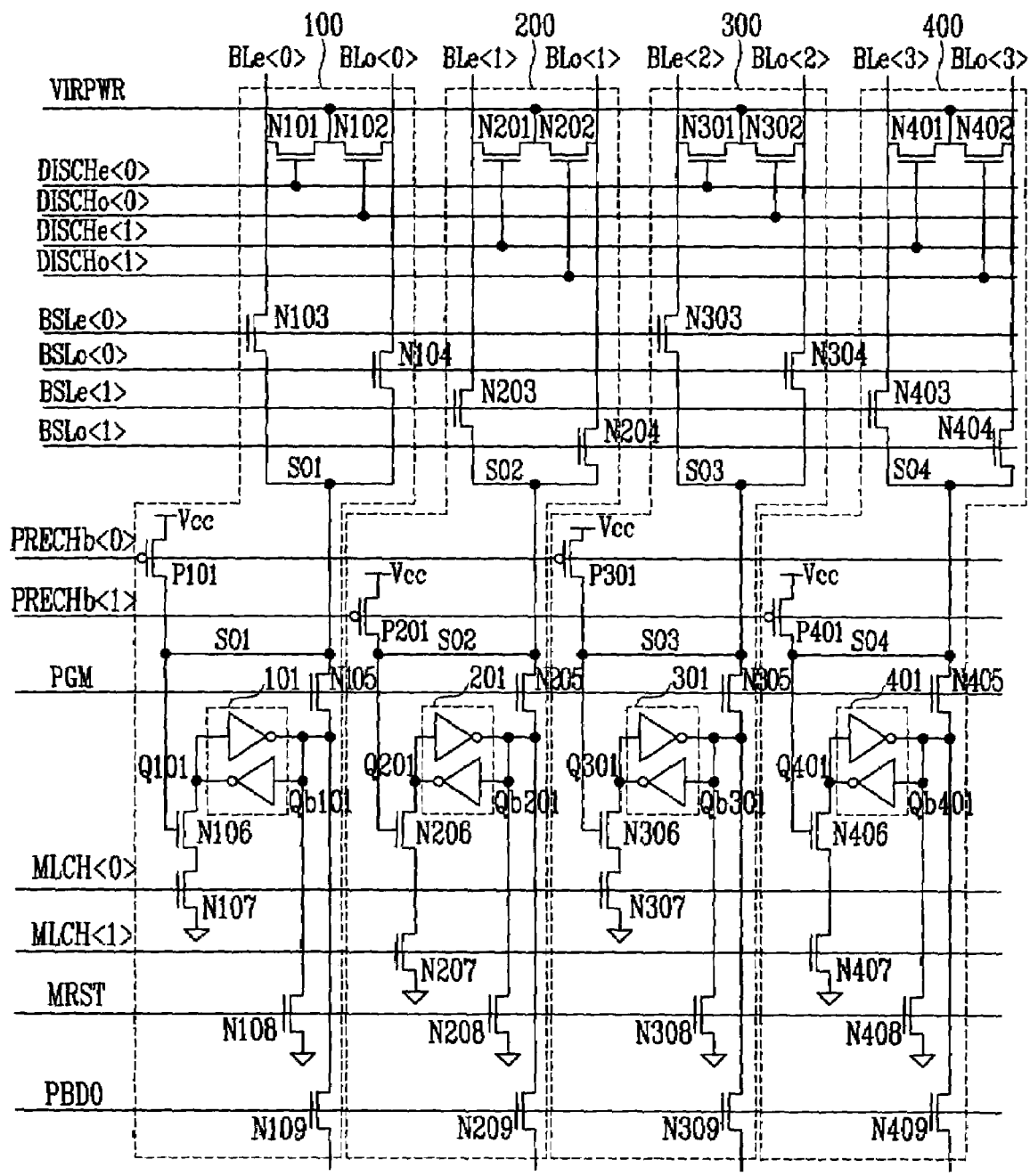
FIG. 2 shows the configuration of page buffers for explaining a disclosed method of reading a NAND type flash memory device.

FIG. 2 shows the configuration of page buffers for explaining a disclosed method of reading the NAND type flash memory device. FIG. 2 is a partial detailed view of FIG. 1. Though a page buffer controller is not shown in FIG. 2, it is to be understood that all signal input to the page buffers are ones generated from the page buffer controller. Furthermore, only four of the plurality of the page buffers are shown in FIG. 2 for convenience of explanation. The configuration of the page buffers will now be described.

Referring to FIG. 2, a first even bit line BLe<0> and a first odd bit line BLo<0> of a memory cell array are connected to a first page buffer 100, a second even bit line BLe<1> and a second odd bit line BLo<1> are connected to a second page buffer 200, a third even bit line BLe<2> and a third odd bit line BLo<2> are connected to a third page buffer 300, and a fourth even bit line BLe<3> and a fourth odd bit line BLo<3> are connected to a fourth page buffer 400. In this case, odd-numbered page buffers such as the first and third page buffers 100 and 300 are driven contemporaneously, and even-numbered page buffers such as the second and fourth page buffers 200 and 400 are driven contemporaneously.

The construction of the page buffer will now be described. First NMOS transistors N101, N201, N301 and N401 are respectively driven according to signals DISCHe<0:1>, and thus apply voltages according to a signal VIRPWR to bit lines BLe<0:3> of the memory cell array, respectively. Second NMOS transistors N102, N202, N302 and N402 are respectively driven according to signals DISCHo<0:1>, and thus apply voltages according to the signal VIRPWR to bit lines BLo<0:3> of the memory cell array, respectively. Third NMOS transistors N103, N203, N303 and N403 are respectively driven according to signals BSLe<0:1>, thus connecting the bit lines BLe<0:3> and nodes SO1, SO2, SO3 and SO4, respectively. Fourth NMOS transistors N104, N204, N304 and N404 are respectively driven according to signals BLSo<0:1>, thus connecting the bit lines BLo<0:3> and the nodes SO1, SO2, SO3 and SO4, respectively. First PMOS transistors P101, P201, P301 and P401 are respectively driven according to signals PRECHb<0:1>, so that a power supply voltage Vcc is supplied to the nodes SO1, SO2, SO3 and SO4, respectively. Fifth NMOS transistors N105, N205, N305 and N405 are respectively driven according to a signal PGM, so that information to be programmed is transmitted to selected bit lines BLe<0:3> and BLo<0:3>. Sixth NMOS transistors N106, N206, N306 and N406 are respectively driven according to electric potentials of the nodes SO1, SO2, SO3 and SO4. Latches 101, 201, 301 and 401 store data from the memory cell array or data to be programmed. Seventh NMOS transistors N107, N207, N307 and N407 are respectively driven according to signals MLCH<0:1>, and thus invert the data stored in the latches 101, 201, 301 and 401. Eighth NMOS transistors N108, N208, N308 and N408 are respectively driven according to a signal MRST, thus initializing the latches 101, 201, 301 and 401. Ninth NMOS transistors N109, N209, N309 and N409 are respectively driven according to a signal PBDO, so that data to be programmed are stored in the latches 101, 201, 301 and 401, respectively.

The method of reading the NAND type flash memory device constructed above will now be described with reference to an operational timing diagram of FIG. 3.

1) Before Time t1: Latch Initialization

If the signal DISCHe<0> and DISCHe<1> are applied as a Low level, the first NMOS transistors N101, N201, N301 and N401 are turned off. If the signal DISCHo<0> and DISCHe<1> are applied as a High level, the second NMOS transistors N102, N202, N302 and N402 are turned on. Accordingly, an electric potential of the signal VIRPWR is supplied to the bit lines BLo<0:3> through the second NMOS transistors N102, N202, N302 and N402. Since the signal VIRPWR upon read operation keeps a voltage of 0V, a voltage of 0V is applied to the bit lines BLo<0:3>. Furthermore, if the signal MRST is applied as a High level, the eighth NMOS transistors N108, N208, N308 and N408 are turned. Thus, the latches 101, 201, 301 and 401 are initialized.

2) Time t1 to t3: Precharge of Bit Lines Connected to Odd-Numbered Page Buffer

If the signal PRECHb<0> is applied as a Low level, the first PMOS transistors P101 and P301 of the odd-numbered page buffers including the first and third page buffers 100 and 300 are turned on, and the power supply voltage Vcc is applied to the nodes SO1 and SO3. Thus, the nodes SO1 and SO3 keep a High level. If the signal BSLe<0> is applied as an electric potential of a first voltage V1 and the signal BSLo<0> is applied as a Low level, the bit lines BLe<0> and BLe<2> are applied with a voltage V1-Vt wherein the first voltage V1 is subtracted from the threshold voltage Vt of the third NMOS transistors N103 and N303, and the bit lines BLe<0> and BLe<2> are thus precharged. Accordingly, if a cell connected to the bit lines BLe<0> and BLe<2> is a program cell, the bit lines BLe<0> and BLe<2> keep the electric potential of V1-Vt. If a cell connected to the bit lines BLe<0> and BLe<2> is an erase cell, the electric potential of the bit lines BLe<0> and BLe<2> is gradually lowered, and then keeps a Low level.

3) Time t2 to t4: Precharge of Bit Lines Connected to Even-Numbered Page Buffer

If the signal PRECHb<1> is applied as a Low level, the first PMOS transistors P201 and P401 of the even-numbered page buffers including the second and fourth page buffers 200 and 400 are turned on, and the power supply voltage Vcc is applied to the nodes SO2 and SO4. Thus, the nodes SO2 and SO4 keep a High level. Furthermore, if the signal BSLe<1> is applied as an electric potential of the first voltage V1 and the signal BSLo<1> is applied as a Low level, the bit lines BLe<1> and BLe<3> are applied with a voltage V1-Vt wherein the first voltage V1 is subtracted from the threshold voltage Vt of the third NMOS transistors N203 and N403, and the bit lines BLe<1> and BLe<3> are precharged. Accordingly, if a cell connected to the bit lines BLe<1> and BLe<3> is a program cell, the bit lines BLe<1> and BLe<3> keep the electric potential of V1-Vt. If a cell connected to the bit lines BLe<1> and BLe<3> is an erase cell, the electric potential of the bit lines BLe<1> and BLe<3> is gradually lowered, and then keeps a Low level.

4) Time t3 to t5: Evaluation of Cell Connected to Odd-Numbered Page Buffer

If the signal BSLe<0> shifts to a Low level and is then applied, an electric potential of the bit lines BLe<0> and BLe<2> keeps the electric potential of V1-Vt when a cell connected to the bit lines BLe<0> and BLe<2> is a program cell. If a cell connected to the bit lines BLe<0> and BLe<2> is an erase cell, however, the electric potential of the bit lines BLe<0> and BLe<2> gradually falls from V1-Vt, and then keeps a Low level. Accordingly, the nodes SO1 and SO3 keep a High level in case of the program cell. In case of the erase cell, however, the electric potential of the nodes SO1 and SO3 gradually falls, and then keeps a Low level.

5) Time t4 to t6: Evaluation of Cell Connected to Even-Numbered Page Buffer

If the signal BSLe<1> shifts to a Low level and is then applied, an electric potential of the bit lines BLe<1> and BLe<3> keep the potential of V1-Vt when a cell connected to the bit lines BLe<1> and BLe<3> is a program cell. If the cell connected to the bit lines BLe<1> and BLe<3> is an erase cell, the electric potential of the bit lines BLe<1> and BLe<3> gradually falls from V1-Vt, and then keeps a Low level. Accordingly, the nodes SO3 and SO3 keep a High level in case of the program cell. In case of the erase cell, however, the electric potential of the nodes SO1 and SO3 gradually falls, and then keeps a Low level.

6) Time t5 to t6: Sensing of Cell Connected to Odd-Numbered Page Buffer

If the signal PRECHb<0> is applied as a High level before the signal BSLe<0> is applied, the first PMOS transistors P101 and P301 are turned off. If the signal BSLe<0> is applied as an electric potential of a second voltage V2 lower than the first voltage V1, the third NMOS transistors N103 and N303 are turned on. By doing so, when a memory cell is a program cell, an electric potential of the bit lines BLe<0> and BLe<2> keeps the electric potential of V1-Vt, and an electric potential of the nodes SO1 and SO3 keeps a High level. If the memory cell is an erase state, however, the electric potential of the bit lines BLe<0> and BLe<2> gradually falls and then keeps a Low level. The electric potential of the nodes SO1 and SO3 keeps a Low level. Further, if the signal MLCH<0> is applied as a High level, nodes Q101 and Q301 keep a Low level when a memory cell is a program cell. Accordingly, nodes Qb101 and Qb301 keep a High level. This is because when the memory cell is the program cell, the nodes SO1 and SO3 keep the High level and the sixth NMOS transistors N106 and N306 are turned on, and the seventh NMOS transistors N107 and N307 are turned on the signal MLCH<0>, and the nodes Q101 and Q301 keep the Low level. On the other hand, if the memory cell is an erase cell, the nodes SO1 and SO3 keep a Low level, and even the nodes Qb101 and Qb301 keep the Low level. Therefore, the status of the memory cell is sensed by detecting the electric potential of the nodes Qb101 and Qb301.

7) Time t6 to t7: Sensing of Cell Connected to Even-Numbered Page Buffer

If the signal PRECHb<1> is applied as a High level before the signal BSLe<1> is applied, the first PMOS transistors P201 and P401 are turned off. If the signal BSLe<1> is applied as an electric potential of a second voltage V2 lower than the first voltage V1, the third NMOS transistors N203 and N403 are turned on. By doing so, when a memory cell is a program cell, an electric potential of the bit lines BLe<1> and BLe<3> keeps the electric potential of V1-Vt, and an electric potential of the nodes SO2 and SO4 keeps a High level. If the memory cell is an erase state, however, the electric potential of the bit lines BLe<1> and BLe<3> gradually falls and then keeps a Low level. The electric potential of the nodes SO2 and SO4 keeps a Low level. Further, if the signal MLCH<1> is applied as a High level, nodes Q201 and Q401 keep a Low level when a memory cell is a program cell. Accordingly, nodes Qb201 and Qb401 keep a High level. This is because when the memory cell is the program cell, the nodes SO2 and SO4 keep the High level and the sixth NMOS transistors N206 and N406 are turned on, and the seventh NMOS transistors N207 and N407 are turned on the signal MLCH<1>, and the nodes Q201 and Q401 keep the Low level. On the other hand, if the memory cell is an erase cell, the nodes SO2 and SO4 keep a Low level, and even the nodes Qb201 and Qb401 keep the Low level. Therefore, the status of the memory cell is sensed by detecting the electric potential of the nodes Qb201 and Qb401.

As described above, by classifying signals into the signals DISCHe and DISCHo, the signals BSLe and BSLo, a signal ORECHb and the signal MLCH, a plurality of page buffers are divided into two groups. A time point where these signals are generated is controlled so that even-numbered page buffers operate while odd-numbered page buffers operate. Accordingly, the peak current is reduced to ½, and erroneous operation due to reduction in power can be prevented.

Meanwhile, as noted above, a plurality of page buffers may be divided into two groups. However, page buffers can be divided into more than two groups. To this end, the page buffers may be divided into as many groups that are needed to divide the peak current. For example, if the page buffers are divided into four groups and are sequentially driven on a four-group basis, the peak current can be reduced to ¼.

As described above, a plurality of page buffers is divided into predetermined groups, and is sequentially driven on a group basis. A power loss problem caused by excessive current consumption occurring since all page buffers operate at the same time can be avoided. Accordingly, disclosed methods are advantageous in that they can prevent erroneous operation due to power loss.

Although the foregoing description has been made with reference to certain preferred embodiments, it is to be understood that changes and modifications may be made by those of ordinary skill in the art without departing from the spirit and scope of this disclosure and the appended claims.

What is claimed is:

1. A method of reading a flash memory device comprising:
   controlling an electric potential of a plurality of bit lines according to status of a predetermined cell to stop a supply of a predetermined voltage to a memory cell;
   dividing a plurality of page buffers into at least two groups, the page buffers being connected to the memory cell array through the plurality of bit lines;
   driving the plurality of page buffers on a group basis to read status of the memory cell, wherein while one of the at least two groups operates, another of the at least two groups starts operation such that the plurality of the page buffer groups is sequentially driven;
   storing a data depending on the status of the memory cell; and
   outputting the data.

2. A method of reading a flash memory device having a page buffer, wherein the page buffer comprises:
   a first transistor that supplies a ground voltage to a selected memory cell through bit lines, according to a discharge signal, for a read operation;
   a second transistor for precharging the bit lines according to control signals applied as different electric potentials, and supplying an electric potential depending upon the status of a cell that is connected to the bit lines to input/output nodes;
   a third transistor for precharging the bit lines by supplying a predetermined voltage to the input/output nodes according to a precharge signal;
   a fourth transistor for allowing program information to be supplied to a selected cell of the memory cell array through a selected bit line, according to a program signal, upon program;

a latch for storing output data from the selected cell of the memory cell array, and outputting the output data to data lines;

a fifth transistor for initializing the latch according to an initialization signal;

a sixth transistor for inverting the output data stored in the latch according to an electric potential and an inversion signal of the input/output node, and the method comprises:

providing the flash memory device consisting of a plurality of the page buffers; and dividing the plurality of the page buffers into predetermined groups by dividing signals for driving the transistors, and sequentially applying the divided signals on a group basis, whereby the page buffers are sequentially driven on a group basis.

3. The method as claimed in claim 2, wherein at least one of the signals for driving the first, second, third and sixth transistors is divided by as many as the number of groups of the pages buffers to be divided.

4. A method of reading a flash memory device having a plurality of page buffers that operate to read the status of a selected cell, the method comprising:

supplying a predetermined voltage through bit lines connected to a selected memory cell, thereby precharging the bit lines;

controlling an electric potential of the hit lines according to the stains of the memory cell to stop the supply of the predetermined voltage; and storing data depending on the status of the memory cell, and outputting the data.

wherein the plurality of the page buffers connected to a memory cell array through the bit lines is divided into two or more groups, and is then driven on a group basis, wherein before one group finishes one reading step, the other group starts a new reading step, whereby the plurality of the page buffer groups is sequentially driven to read the status of a given cell.

* * * * *

UNITED STATES PATENT AND TRADEMARK OFFICE
CERTIFICATE OF CORRECTION

PATENT NO.          : 7,403,431 B2
APPLICATION NO. : 11/103383
DATED                   : July 22, 2008
INVENTOR(S)        : Duck Ju Kim Page 1 of 1

It is certified that error appears in the above-identified patent and that said Letters Patent is hereby corrected as shown below:

<u>On the Title Page:</u>

Item (57), lines 4-5, "two group" should be -- two groups --.

<u>In the Claims:</u>

At Column 8, line 8, "stains" should be -- status --.

At Column 8, line 12, "data." should be -- data, --.

Signed and Sealed this

Eighteenth Day of November, 2008

JON W. DUDAS
*Director of the United States Patent and Trademark Office*